(12) United States Patent
Lee

(10) Patent No.: US 10,468,830 B2
(45) Date of Patent: Nov. 5, 2019

(54) PADDLE CARD AND PLUG-CABLE ASSEMBLY

(71) Applicant: VIA Technologies, Inc., New Taipei (TW)

(72) Inventor: Sheng-Yuan Lee, New Taipei (TW)

(73) Assignee: VIA Technologies, Inc., New Taipei (TW)

(*) Notice: Subject to any disclaimer, the term of this patent is extended or adjusted under 35 U.S.C. 154(b) by 160 days.

(21) Appl. No.: 15/092,616

(22) Filed: Apr. 7, 2016

(65) Prior Publication Data

US 2017/0062991 A1 Mar. 2, 2017

Related U.S. Application Data

(60) Provisional application No. 62/213,602, filed on Sep. 2, 2015.

(30) Foreign Application Priority Data

Dec. 14, 2015 (TW) .............................. 104141990 A

(51) Int. Cl.
*H01R 13/658* (2011.01)
*H01R 13/6591* (2011.01)
(Continued)

(52) U.S. Cl.
CPC ..... *H01R 13/6591* (2013.01); *H01R 13/6585* (2013.01); *H01R 13/6658* (2013.01);
(Continued)

(58) Field of Classification Search
CPC ..... H01R 13/6585–6588; H05K 1/025; H05K 1/0225; H05K 1/0222; H05K 1/0245; H05K 2201/09309
See application file for complete search history.

(56) References Cited

U.S. PATENT DOCUMENTS 7,244,126 B2 * 7/2007 Morana .............. H01R 13/6658
439/76.1
7,520,757 B2 * 4/2009 Bartholomew ...... H05K 1/0219
439/76.1
(Continued)

FOREIGN PATENT DOCUMENTS

CN 2746730 12/2005
CN 1996677 7/2007
(Continued)

OTHER PUBLICATIONS

"Office Action of China Counterpart Application," dated Aug. 31, 2017, p. 1-p. 15, in which the listed references were cited.

*Primary Examiner* — Felix O Figueroa
(74) *Attorney, Agent, or Firm* — JCIPRNET

(57) ABSTRACT

A paddle card includes a circuit board, a pad group and ground planes. The circuit board has an upper surface and a lower surface opposite to each other. The pad group is adapted to connect wires of a cable or terminals of a plug, and includes a pair of upper differential pads on the upper surface and a pair of lower differential pads on the lower surface. The pair of upper differential pads and the pair of lower differential pads are corresponding to each other respectively and configured up and down. The ground planes are spaced at intervals between the upper surface and the lower surface. The ground plane below the pair of upper differential pads has an opening corresponding thereto. A portion of the at least one ground plane between the pair of upper differential pads and the pair of lower differential pads is solid as a shield.

30 Claims, 4 Drawing Sheets

(51) Int. Cl.
*H01R 13/6585* (2011.01)
*H01R 13/66* (2006.01)
*H05K 1/02* (2006.01)
*H05K 1/11* (2006.01)

(52) U.S. Cl.
CPC ........... *H05K 1/025* (2013.01); *H05K 1/0225* (2013.01); *H05K 1/0245* (2013.01); *H05K 1/117* (2013.01); *H05K 2201/09309* (2013.01)

(56) References Cited

U.S. PATENT DOCUMENTS

| | | |
|---|---|---|
| 9,698,535 B2 * | 7/2017 | Cornelius .......... H01R 13/6469 |
| 2012/0051001 A1 | 3/2012 | Wu et al. |
| 2014/0206230 A1 * | 7/2014 | Rost ....................... H01R 9/032 |
| | | 439/607.01 |
| 2017/0018881 A1 * | 1/2017 | Patel ................. H01R 13/6471 |
| 2017/0149183 A1 * | 5/2017 | Gou .................... H01R 12/716 |

FOREIGN PATENT DOCUMENTS

| | | |
|---|---|---|
| CN | 101472388 | 7/2009 |
| CN | 102300400 | 12/2011 |
| CN | 204205243 | 3/2015 |
| JP | 4962660 | 6/2012 |

* cited by examiner

| A12 | A11 | A10 | A9 | A8 | A7 | A6 | A5 | A4 | A3 | A2 | A1 |
|---|---|---|---|---|---|---|---|---|---|---|---|
| GND | RX2+ | RX2− | Vbus | SBU1 | D− | D+ | CC | Vbus | TX1− | TX1+ | GND |
| GND | TX2+ | TX2− | Vbus | $V_{CONN}$ |  |  | SBU2 | Vbus | RX1− | RX1+ | GND |
| B1 | B2 | B3 | B4 | B5 | B6 | B7 | B8 | B9 | B10 | B11 | B12 |

PADDLE CARD AND PLUG-CABLE ASSEMBLY

CROSS-REFERENCE TO RELATED APPLICATION

This application claims the priority benefits of U.S. provisional application Ser. No. 62/213,602, filed on Sep. 2, 2015 and Taiwan application serial no. 104141990, filed on Dec. 14, 2015. The entirety of each of the above-mentioned patent applications is hereby incorporated by reference herein and made a part of this specification.

BACKGROUND OF THE INVENTION

Technical Field

The invention relates to a plug cable assembly, and more specifically relates to a paddle card and a plug cable assembly to which the paddle card is applied.

Background

In computer device and portable device, universal serial bus (herein after USB) interface is the most common interface. When the trend of computer device and portable device is towards smaller, thinner, and lighter, USB Type-C is recently developed USB interface specification and widely applied to computer apparatus and portable device. USB Type-C is designed to meet advanced use and strengthening requirements simultaneously. USB Type-C is able to support the USB power transmission specification of the existing USB 2.0, USB 3.1, and more pad lanes and reversible feature are also added to the USB Type C. Because of the reversible feature, the circuit board or adaption board applied to USB Type-C connector and cable soldering are not able to easily ensure the effectiveness of high-speed signal connection, the aforementioned high-speed signal is USB 3.1 Gen 1 (5G bps) or Gen 2 (10G bps) high-speed signal, for example.

SUMMARY

The invention provides a paddle card which is adapted to connect a cable and a plug of a plug cable assembly for increasing electrical efficiency.

The invention provides a plug cable assembly, its paddle card is adapted to connect its cable and plug for increasing electrical efficiency.

A paddle card of the invention is adapted to connect a cable and a plug of a plug cable assembly. The paddle card includes a circuit board, a pad group and a plurality of ground planes. The circuit board has an upper surface and a lower surface opposite to each other. The pad group is adapted to connect a plurality of wires of the cable or a plurality of terminals of the plug. The pad group includes an upper pad lane and a lower pad lane. The upper pad lane is disposed on the upper surface and includes a pair of first upper differential pads. The lower pad lane is disposed on the lower surface and includes a pair of first lower differential pads. The pair of first upper differential pads and the pair of first lower differential pads are corresponding to each other respectively and configured up and down. The ground planes are spaced at intervals between the upper surface and the lower surface. One or more of the ground planes closer to the pair of first upper differential pads each has a first upper opening, an orthogonal projection of the pair of first upper differential pads on a geometric plane that the first upper opening is located in is overlapped with the first upper opening, and a portion of at least one ground plane between the pair of first upper differential pads and the pair of first lower differential pads is solid.

A plug cable assembly of the invention includes a cable, a plug, and a paddle card. The paddle card connects the cable with the plug. The paddle card includes a circuit board, a pad group and a plurality of ground planes. The circuit board has an upper surface and a lower surface opposite to each other. The pad group is connected to a plurality of wires of the cable or a plurality of terminals of the plug. The pad group includes an upper pad lane and a lower pad lane. The upper pad lane is disposed on the upper surface and includes a pair of first upper differential pads. The lower pad lane is disposed on the lower surface and includes a pair of first lower differential pads. The pair of first upper differential pads and the pair of first lower differential pads are corresponding to each other respectively and configured up and down. The ground planes are spaced at intervals between the upper surface and the lower surface. One or more of the ground planes closer to the pair of first upper differential pads each has a first upper opening, an orthogonal projection of the pair of first upper differential pads on a geometric plane that the first upper opening is located in is overlapped with the first upper opening, and a portion of at least one ground plane between the pair of first upper differential pads and the pair of first lower differential pads is solid.

Based on the above, in the invention, at least an opening is formed at a ground plane below the receiving differential pads in pairs of the paddle card for achieving impedance matching, and simultaneously, the opening is not formed at another ground plane for preventing crosstalk between two opposite pairs of differential pads (such as a pair of transmitting differential pads and a pair of receiving differential pads).

In order to make the aforementioned and other features and advantages of the invention more comprehensible, embodiments accompanying figures are described in detail belows.

DETAILED DESCRIPTION OF DISCLOSED EMBODIMENTS

Figure 1:
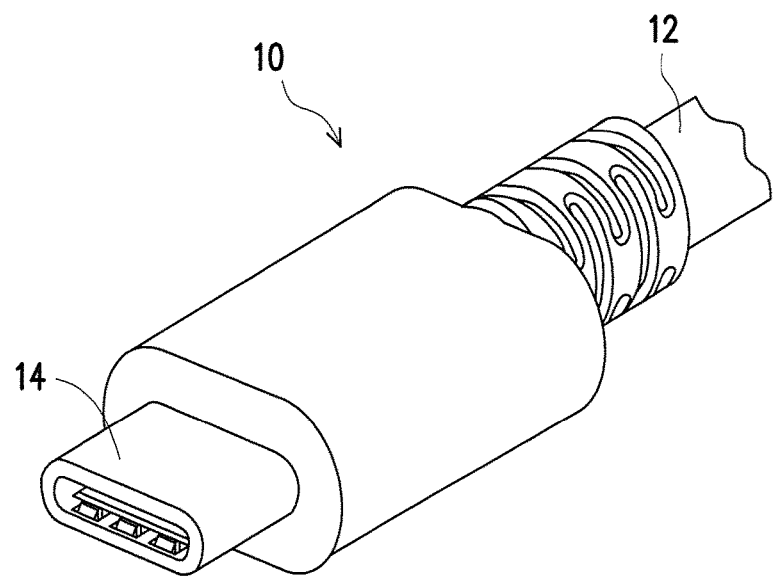
FIG. 1 is a three dimensional view of a plug cable assembly of one embodiment of the invention.
Figure 2:
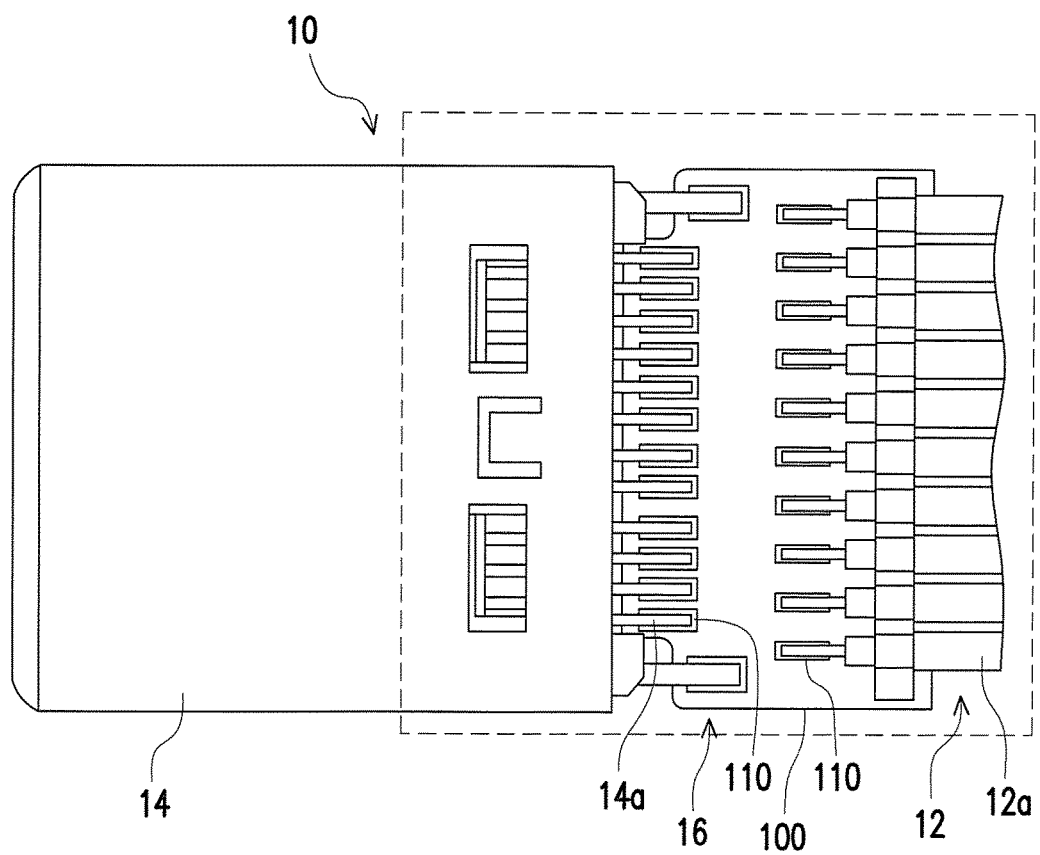
FIG. 2 is a partial top view of the plug cable assembly in FIG. 1.

Referring to FIGS. 1 and 2, in the present embodiment, the plug cable assembly 10 may be a plug cable assembly compliant with USB Type-C interface specification. The plug cable assembly 10 includes a cable 12, a plug 14, and a paddle card 16. The paddle card 16 connects the cable 12 with the plug 14, so that the cable 12 is electrically connected to the plug 14 through the paddle card 16. To be more specific, the paddle card 16 includes a circuit board 100 and a plurality of pads 110, and the pads 110 are located on two surfaces of the circuit board 100. A plurality of wires 12a of the cable 12 are respectively connected to a plurality of pads 110 of the paddle card 16, and a plurality of terminals 14a of the plug 14 are respectively connected to a plurality of pads 110 of the paddle card 16.

Figures 3, 4:
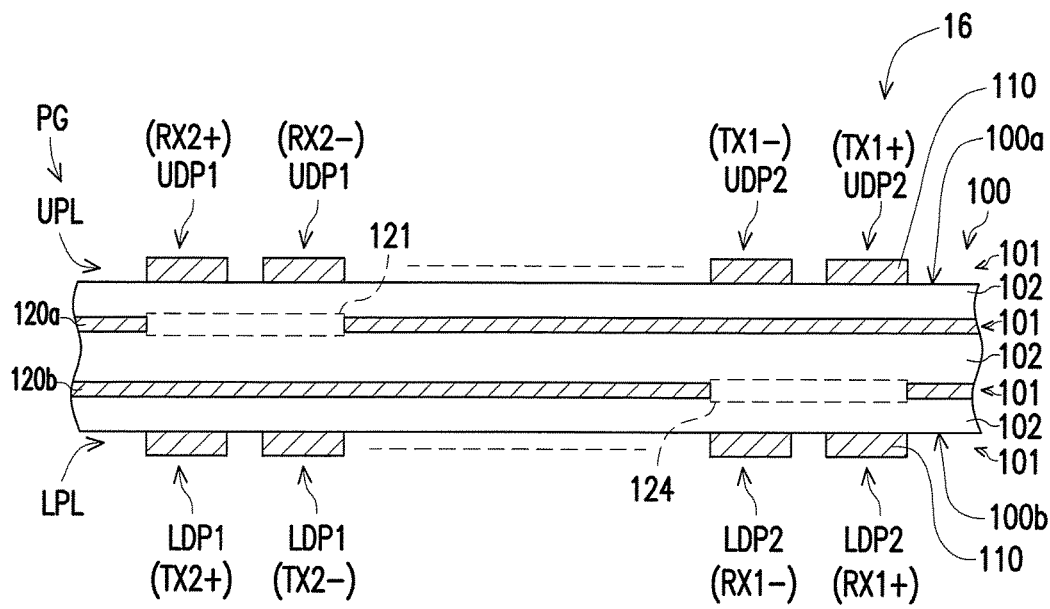
FIG. 3 is a pin arrangement of the plug cable assembly in FIG. 1.
FIG. 4 is a cross-sectional schematic view of a paddle card in FIG. 2.

Referring to FIGS. 2 and 3, when the plug cable assembly 10 is compliant with USB Type-C specification, the electrical configuration of the pads 110, which are adapted to connect to the wires 12a of the cable 12 or adapted to connect to the terminals 14a of the plug 14 as shown in FIG. 2, is shown in FIG. 3. GND represents ground connection. TX1+ and TX1− represent a transmitting differential pair, RX1+ and RX1− represent a receiving differential pair, TX2+ and TX2− represent another transmitting differential pair, RX2+ and RX2− represent another receiving differential pair, D+ and D− represent the transmitting/receiving differential pair of USB 2.0 specification or older generation. TX transmits differential pairs and RX receives differential pairs perform in full-duplex mode, and D transmits/receives differential pairs perform in half-duplex mode. Vbus represents power source, CC represents the direction to connect to the cable for establishing signal, SBU1 and SBU2 represent a side-band usage that is defined according to USB specification, and $V_{CONN}$ represents power supply. The detailed description of the USB Type-C specification may be obtained from the official website of the specification makers and drawers.

Referring to FIG. 4, the paddle card 16 includes a circuit board 100 formed by alternately superimposing a plurality of patterned conductive layers 101 and a plurality of dielectric layers 102, and the pads 110 are formed by the corresponding outermost patterned conductive layer 101. In the present embodiment, the circuit board 100 of the paddle card 16 is, for example, a four-layer board which is a circuit board having four patterned conductive layers 101. The circuit board 100 has an upper surface 100a and a lower surface 100b opposite to the upper surface 100a. The paddle card 16 includes a pad group PG and a plurality of ground planes 120a and 120b. The pad group PG is formed by a plurality of pads 110 which are shown in FIG. 2 and adapted to connect a plurality of wires 12a of the cable 12 or a plurality of terminals 14a of the plug 14. The pad group PG includes an upper pad lane UPL and a lower pad lane LPL which are also formed by a plurality of pads 110. The electrical configuration of the upper pad lane UPL of the pad group PG and the pads 110 of the lower pad lane LPL is compliant with USB TYPE-C specification, as shown in FIG. 3. Each of the ground planes 120a and 120b may occupy on a partial area of the patterned conductive layer 101, and power plane and signal lines are distributed on the other area of the patterned conductive layer 101 according to requirements.

Referring to FIG. 4, the upper pad lane UPL is disposed on the upper surface 100a of the circuit board 100 of the paddle card 16 and includes a pair of first upper differential pads UDP1. The lower pad lane LPL is disposed on the lower surface 100b of the circuit board 100 of the paddle card 16 and includes a pair of first lower differential pads LDP1. The pair of first upper differential pads UDP1 and the pair of first lower differential pads LDP1 are corresponding to each other respectively and configured up and down. In one embodiment, the pair of first upper differential pads UDP1 are respectively aligned with the pair of first lower differential pads LDP1, it means that the projections of the two pairs of upper and lower differential pads on the ground plane are overlapped. The ground planes 120a and 120b are spaced at intervals between the upper surface 100a and the lower surface 100b. In addition, referring to FIG. 5, take the pair of first upper differential pads UDP1 and the pair of first lower differential pads LDP1 as an example, the ground planes 120a and 120b are located between the pair of first upper differential pads UDP1 and the pair of first lower differential pads LDP1.

Figure 5:
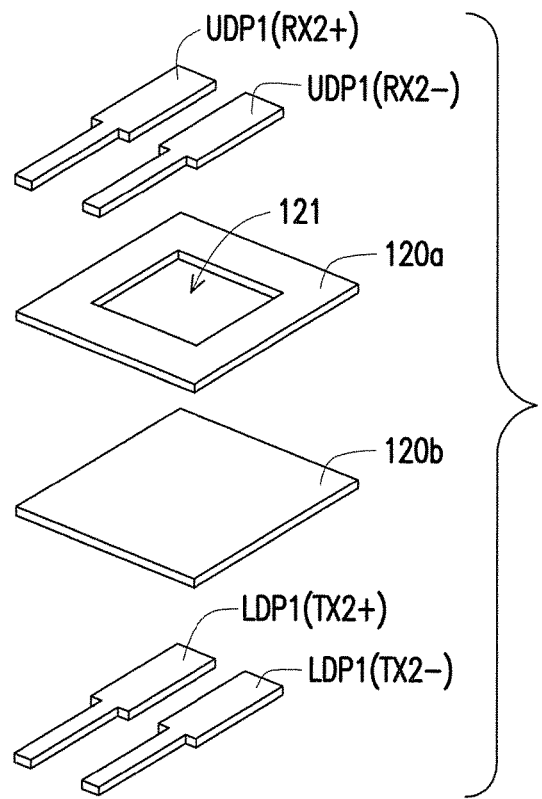
FIG. 5 is partial three dimensional view of a pair of first upper differential pads, ground planes, and a pair of first lower differential pads of the paddle card in FIG. 4.

Referring to FIGS. 4 and 5, when the pair of first upper differential pads UDP1 are the receiving differential pair RX2+ and RX2− and the pair of first lower differential pads LDP1 are the transmitting differential pair TX2+ and TX2−, the ground plane 120a closer to the pair of first upper differential pads UDP1 may have a first upper opening 121, the orthogonal projection of the pair of first upper differential pads UDP1 on a geometric plane that the first upper opening 121 is located in is overlapped with the first upper opening 121. Because the signal becomes weaker through the receiving differential pair RX2+ and RX2− of the first upper differential pads UDP1 and is interfered easily, therefore, the character impedance coupling between the ground planes 120a and 120b and the pair of first upper differential pads UDP1 is enhanced via the first upper opening 121 in order to maintain the impedance matching of differential signal path as much as possible. Simultaneously, a portion of another ground plane 120b between the pair of first upper differential pads UDP1 and the pair of first lower differential pads LDP1 is solid, it means that the ground plane 120b does not have the first upper opening 121 as above-mentioned, therefore, a shield is provided between the pair of first upper differential pads UDP1 and the pair of first lower differential pads LDP1, so as to prevent crosstalk between the pair of first upper differential pads UDP1 and the pair of first lower differential pads LDP1.

Referring to FIG. 4, in the present embodiment, the upper pad lane UPL includes a pair of second upper differential pads UDP2, the lower pad lane LPL includes a pair of second lower differential pads LDP2. The pair of second upper differential pads UDP2 and the pair of second lower differential pads LDP2 are corresponding to each other respectively and configured up and down. In one embodiment, the pair of second upper differential pads UDP2 are respectively aligned with the pair of second lower differential pads LDP2, it means that the projections of the two pairs of upper and lower differential pads on the ground plane are overlapped. When the pair of second upper differential pads UDP2 are the transmitting differential pair TX1+ and TX1− and the pair of second lower differential pads LDP2 are the receiving differential pair RX1+ and RX1−, one of the ground planes 120a and 120b closer to the pair of second lower differential pads LDP2 (namely the ground plane 120b) has a second lower opening 124, and the orthogonal projection of the pair of second lower differential pads LDP2 on a geometric plane that the second lower opening 124 is located in is overlapped with the second lower opening 124.

Figure 6:
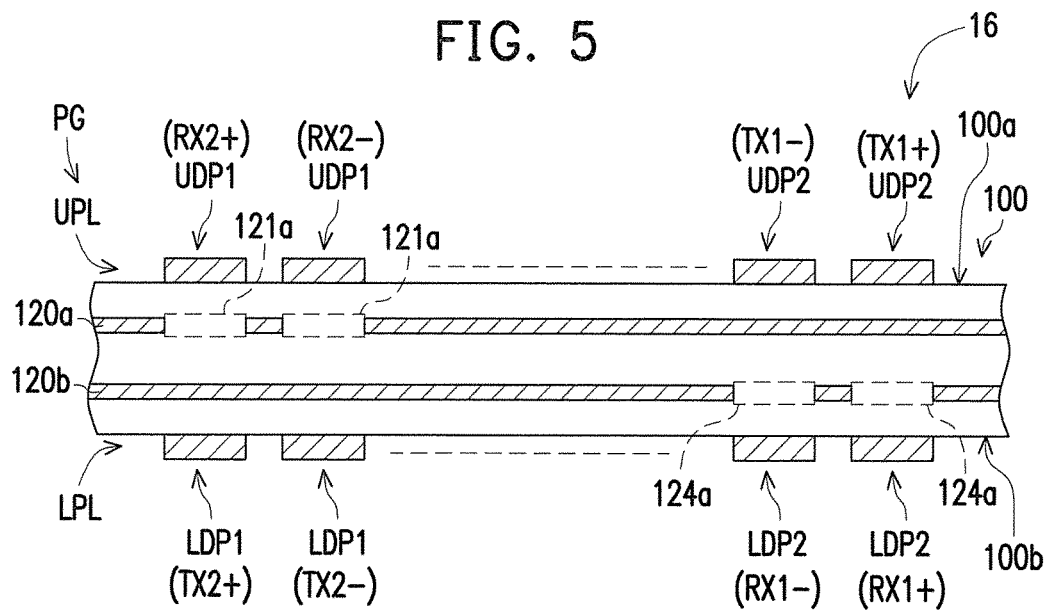
FIG. 6 is a cross-sectional schematic view of a paddle card of another embodiment of the invention.

In comparison with the embodiment in FIG. 4, in another embodiment in FIG. 6, the first upper opening 121 includes a pair of first upper sub-openings 121a, and the orthogonal projection of the pair of first upper differential pads UDP1 on a geometric plane that the first upper sub-openings 121a are located in is overlapped with the first upper sub-openings 121a respectively. Similarly, the second lower opening 124 includes a pair of second lower sub-openings 124a, and the orthogonal projection of the pair of second lower differential pads LDP2 on a geometric plane that the second lower sub-openings 124a are located in is overlapped with the second lower sub-openings 124a respectively.

Figure 7:
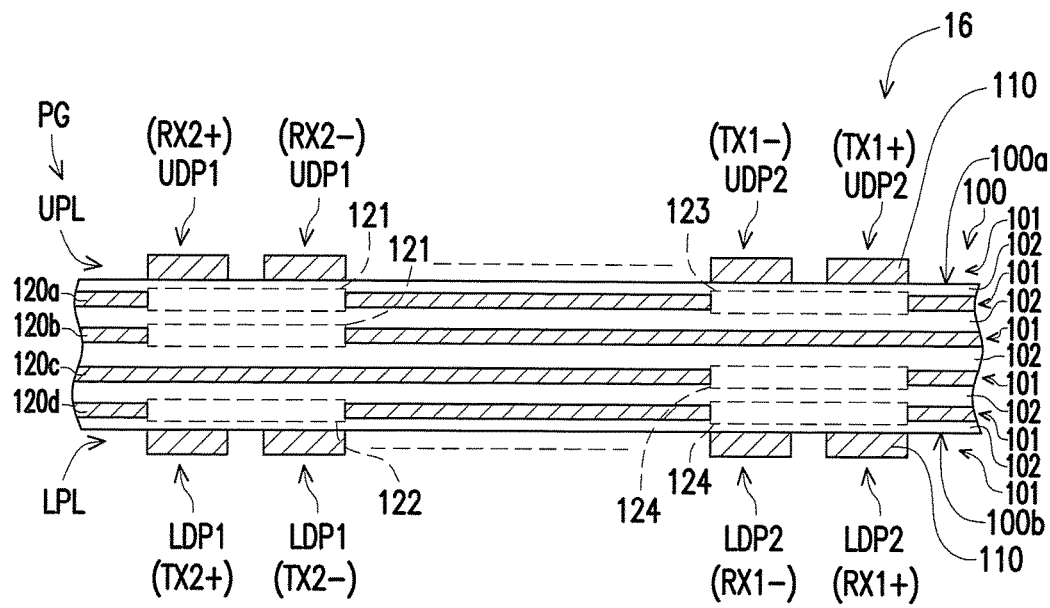
FIG. 7 is a cross-sectional schematic view of a paddle card of another embodiment of the invention.

By comparison with the embodiment in FIG. 4, in another present embodiment in FIG. 7, the circuit board 100 of the paddle card 16 is, for example, a six-layer board which is a circuit board having six patterned conductive layers 101. The paddle card 16 includes four ground planes 120a, 120b, 120c, and 120d. When the pair of first upper differential pads UDP1 are the receiving differential pair RX2+ and RX2−, and the pair of first lower differential pads LDP1 are the transmitting differential pair TX2+ and TX2−, in order to enhance the character impedance for maintaining the impedance matching of the differential signal path, some of the ground planes 120a, 120b, 120c, and 120d closer to the pair of first upper differential pads UDP1 (namely the ground plane 120a and the ground plane 120b) each has a first upper opening 121, and the orthogonal projection of the pair of first upper differential pads UDP1 on a geometric plane that the first upper opening 121 is located in is overlapped with the first upper opening 121. In the present embodiment, each of the ground planes 120a and 120b closer to the pair of first upper differential pads UDP1 has a first upper opening 121. On the other hand, in order to enhance the character impedance for maintaining the impedance matching of the differential signal path, one of ground planes 120a, 120b, 120c, and 120d closer to the pair of first lower differential pads LDP1 (namely the ground plane 120d) has a first lower opening 122, the orthogonal projection of the pair of first lower differential pads LDP1 on a geometric plane that the first lower opening 122 is located in is overlapped with the first lower opening 122. It should be noted here, because the signal becomes weaker through the receiving differential pair RX2+ and RX2− of the first upper differential pads UDP1 and is interfered easily, therefore, the number of the ground planes 120a and 120b having the first upper opening 121 is greater than the number of ground plane 120d having the first lower opening 122. In other words, the number of the first upper openings 121 is greater than the number of the first lower openings 122, so as to effectively enhance the character impedance between the ground plane and the receiving differential pair for maintaining the impedance matching of the differential signal path. On the other hand, a portion of another ground plane 120c between the pair of first upper differential pads UDP1 and the pair of first lower differential pads LDP1 is solid, it means that ground plane 120c does not have the first upper opening 121 or the first lower opening 122 as above-mentioned, therefore, a shield is provided between the pair of first upper differential pads UDP1 and the pair of first lower differential pads LDP1, so as to prevent crosstalk between the pair of first upper differential pads UDP1 and the pair of first lower differential pads LDP1.

Referring to FIG. 7, in the present embodiment, similarly, when the pair of second upper differential pads UDP2 are the transmitting differential pair TX1+ and TX1− and the pair of second lower differential pads LDP2 are the receiving differential pair RX1+ and RX1−, in order to enhance the character impedance for maintaining the impedance matching of the differential signal path, some of the ground planes 120a, 120b, 120c, and 120d closer to the pair of second lower differential pads LDP2 (namely the ground plane 120c and the ground plane 120d) each has a second lower opening 124, and the orthogonal projection of the pair of second lower differential pads LDP2 on a geometric plane that the second lower opening 124 is located in is overlapped with the second lower opening 124. In the present embodiment, each of the ground planes 120c, 120d closer to the pair of second lower differential pads LDP2 has a second lower opening 124. On the other hand, in order to enhance the character impedance for maintaining the impedance matching of the differential signal path, one of the ground planes 120a, 120b, 120c, and 120d closer to the pair of second upper differential pads UDP2 (namely the ground plane 120a) has a second upper opening 123, and the orthogonal projection of the pair of second upper differential pads UDP2 on a geometric plane that the second upper opening 123 is located in is overlapped with the second upper opening 123. It should be noted here, because the signal becomes weaker through the receiving differential pair RX1+ and RX1− of the second lower differential pads LDP2 and is interfered easily, therefore, the number of the ground planes 120c, 120d having the second lower opening 124 is greater than the number of the ground plane 120a having the second upper opening 123. In other words, the number of the second lower openings 124 is greater than the number of the second upper openings 123, so as to effectively enhance the character impedance between the ground plane and the receiving differential pair for maintaining the impedance matching of the differential signal path. On the other hand, a portion of the ground plane 120b between the pair of second upper differential pads UDP2 and the pair of second lower differential pads LDP2 is solid, it means that ground plane 120b does not have the second upper opening 123 or the second lower opening 124 as above-mentioned, therefore, a shield is provided between the pair of second upper differential pads UDP2 and the pair of second lower differential pads LDP2, so as to prevent crosstalk between the pair of second upper differential pads UDP2 and the pair of second lower differential pads LDP2.

Figure 8:
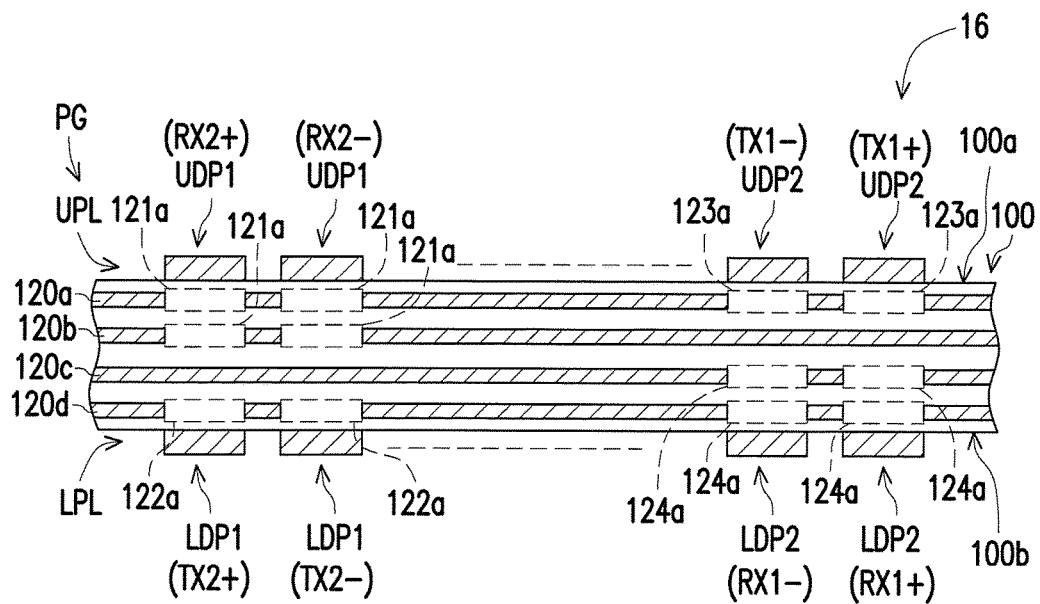
FIG. 8 is a cross-sectional schematic view of a paddle card of another embodiment of the invention.

By comparison with the embodiment in FIG. 7, in another embodiment in FIG. 8, the first upper opening 121 includes a pair of first upper sub-openings 121a, and the orthogonal projection of the pair of first upper differential pads UDP1 on a geometric plane that the first upper sub-openings 121a are located in is overlapped with the first upper sub-openings 121a respectively. The first lower opening 122 includes a pair of first lower sub-openings 122a, and the orthogonal projection of the pair of first lower differential pads LDP1 on a geometric plane that the first lower sub-openings 122a are located in is overlapped with the first lower sub-openings 122a respectively. The second upper opening 123 includes a pair of second upper sub-openings 123a, and the orthogonal projection of the pair of second upper differential pads UDP2 on a geometric plane that the second upper sub-openings 123a are located in is overlapped with the second upper sub-openings 123a respectively. The second lower opening 124 includes a pair of second lower sub-openings 124a, and the orthogonal projection of the pair of second lower differential pads LDP2 on a geometric plane that the second lower sub-openings 124a are located in is overlapped with the second lower sub-openings 124a respectively.

The term "upper" or "lower" as aforementioned is only used to describe the difference between the elements, but the differential pads, the ground opening, and the differential signal passing through the differential pads of the invention are not limited thereto.

In summary, in the invention, at least an opening is formed at a ground plane below the receiving differential pads in pairs of the paddle card for achieving impedance matching, and simultaneously, the opening is not formed at another ground plane for preventing crosstalk between two opposite pairs of differential pads (such as a pair of transmitting differential pads and a pair of receiving differential pads). In the manufacturing process, the opening only needs being simultaneously formed when the ground plane is formed and none of additional manufacturing steps is added, and thus the manufacturing cost will not be increased.

Although the invention has been disclosed with reference to the aforesaid embodiments, they are not intended to limit the invention. It will be apparent to one of ordinary skill in the art that modifications and variations to the described embodiments may be made without departing from the spirit and the scope of the invention. Accordingly, the scope of the invention will be defined by the attached claims and not by the above detailed descriptions.

What is claimed is:

1. A paddle card adapted to connect a cable and a plug of a plug cable assembly, comprising:
    a circuit board having an upper surface and a lower surface opposite to each other;
    a pad group adapted to connect a plurality of wires of the cable or a plurality of terminals of the plug, comprising:
        an upper pad lane disposed on the upper surface and comprising a pair of first upper differential pads and a pair of second upper differential pads on one side of the pair of first upper differential pads; and
        a lower pad lane disposed on the lower surface and comprising a pair of first lower differential pads and a pair of second lower differential pads on one side of the pair of first lower differential pads, wherein the pair of first upper differential pads are corresponding to the pair of first lower differential pads respectively and configured up and down, and the pair of second upper differential pads and the pair of second lower differential pads are corresponding to each other respectively and configured up and down,
        wherein the pair of first upper differential pads is a receiving differential pair, and the pair of first lower differential pads is a transmitting differential pair;
        wherein the pair of first upper differential pads, the pair of first lower differential pads, the pair of second upper differential pads, and the pair of second lower differential pads are electrically disconnected with each other; and
    a plurality of ground planes spaced at intervals between the upper surface and lower surface, wherein one or more of the ground planes closer to the pair of first upper differential pads each has a first upper opening, an orthogonal projection of the pair of first upper differential pads on a geometric plane that the first upper opening is located in is overlapped with the first upper opening, an orthogonal projection of at least a portion of a plurality of pads located between the pair of first upper differential pads and the pair of second upper differential pads of the upper pad lane is not located in the first upper opening, and a portion of at least one ground plane between the pair of first upper differential pads and the pair of first lower differential pads is solid.

2. The paddle card as recited in claim 1, wherein the first upper opening comprises a pair of first upper sub-openings, and the orthogonal projection of the pair of first upper differential pads on a geometric plane that the first upper sub-openings are located in is overlapped with the first upper sub-openings respectively.

3. The paddle card as recited in claim 1, wherein one or more of the ground planes closer to the pair of first lower differential pads each has a first lower opening, an orthogonal projection of the pair of first lower differential pads on a geometric plane that the first lower opening is located in is overlapped with the first lower opening, and an orthogonal projection of at least a portion of a plurality of pads located between the pair of first lower differential pads and the pair of second lower differential pads of the lower pad lane is not located in the first lower opening.

4. The paddle card as recited in claim 3, wherein a number of the ground planes having the first upper opening are greater than a number of the ground planes having the first lower opening.

5. The paddle card as recited in claim 3, wherein the first upper opening comprises a pair of first upper sub-openings, the first lower opening comprises a pair of first lower sub-openings, the orthogonal projection of the pair of first upper differential pads on a geometric plane that the first upper sub-openings are located in is overlapped with the first upper sub-openings respectively, and the orthogonal projection of the pair of first lower differential pads on a geometric plane that the first lower sub-openings are located in is overlapped with the first lower sub-openings respectively.

6. The paddle card as recited in claim 1, wherein one or more of the ground planes closer to the pair of second lower differential pads each has a second lower opening, an orthogonal projection of the pair of second lower differential pads on a geometric plane that the second lower opening is located in is overlapped with the second lower opening, an orthogonal projection of at least a portion of a plurality of pads located between the pair of first lower differential pads and the pair of second lower differential pads of the lower pad lane is not located in a first lower opening and the second lower opening, and the pair of second upper differential pads and the pair of second lower differential pads have a solid ground plane therebetween.

7. The paddle card as recited in claim 6, wherein the first upper opening comprises a pair of first upper sub-openings, the second lower opening comprises a pair of second lower sub-openings, the orthogonal projection of the pair of first upper differential pads on a geometric plane that the first upper sub-openings are located in is overlapped with the first upper sub-openings respectively, and the orthogonal projection of the pair of second lower differential pads on a geometric plane that the second lower sub-openings are located in is overlapped with the second lower sub-openings respectively.

8. The paddle card as recited in claim 6, wherein one or more of the ground planes closer to the pair of first lower differential pads each has the first lower opening, one or more of the ground planes closer to the pair of second upper differential pads each has a second upper opening, an orthogonal projection of the pair of first lower differential pads on a geometric plane that the first lower opening is located in is overlapped with the first lower opening, an orthogonal projection of at least a portion of a plurality of pads located between the pair of first upper differential pads and the pair of second upper differential pads of the upper pad lane is not located in the first upper opening and the second opening, and an orthogonal projection of the pair of second upper differential pads on a geometric plane that the second upper opening is located in is overlapped with the second upper opening.

9. The paddle card as recited in claim 8, wherein a number of the ground planes having the first upper opening are greater than a number of the ground planes having the first lower opening, and a number of the ground planes having the second lower opening are greater than a number of the ground planes having the second upper opening.

10. The paddle card as recited in claim 8, wherein the first upper opening comprises a pair of first upper sub-openings, the first lower opening comprises a pair of first lower sub-openings, the second upper opening comprises a pair of second upper sub-openings, the second lower opening comprises a pair of second lower sub-openings, the orthogonal projection of the pair of first upper differential pads on a geometric plane that the first upper sub-openings are located in is overlapped with the first upper sub-openings respectively, the orthogonal projection of the pair of first lower differential pads on a geometric plane that the first lower sub-openings are located in is overlapped with the first lower sub-openings respectively, the orthogonal projection of the pair of second upper differential pads on a geometric plane that the second upper sub-openings are located in is overlapped with the second upper sub-openings respectively, and the orthogonal projection of the pair of second lower differential pads on a geometric plane that the second lower sub-openings are located in is overlapped with the second lower sub-openings respectively.

11. The paddle card as recited in claim 1, wherein the upper pad lane and the lower pad lane comply USB TYPE-C specification.

12. The paddle card as recited in claim 1, wherein the pair of first upper differential pads are respectively aligned with the pair of first lower differential pads.

13. The paddle card as recited in claim 1, wherein no trace is disposed between the pair of first upper differential pads and the pair of second upper differential pads on the upper surface.

14. The paddle card as recited in claim 1, wherein no trace is disposed between the pair of first lower differential pads and the pair of second lower differential pads on the lower surface.

15. A plug cable assembly, comprising:
a cable:
a plug: and
a paddle card connecting the cable with the plug, comprising:
 a circuit board having an upper surface and a lower surface opposite to each other;
 a pad group connected to a plurality of wires of the cable, comprising:
  an upper pad lane disposed on the upper surface and comprising a pair of first upper differential pads and a pair of second upper differential pads on one side of the pair of first upper differential pads; and
  a lower pad lane disposed on the lower surface and comprising a pair of first lower differential pads and a pair of second lower differential pads on one side of the pair of first lower differential pads, wherein the pair of first upper differential pads are corresponding to the pair of first lower differential pads respectively and configured up and down, and the pair of second upper differential pads and the pair of second lower differential pads are corresponding to each other respectively and configured up and down,
  wherein the pair of first upper differential pads is a receiving differential pair, and the pair of first lower differential pads is a transmitting differential pair;
  wherein the pair of first upper differential pads, the pair of first lower differential pads, the pair of second upper differential pads, and the pair of second lower differential pads are electrically disconnected with each other; and
 a plurality of ground planes spaced at intervals between the upper surface and lower surface, wherein one or more of the ground planes closer to the pair of first upper differential pads each has a first upper opening, an orthogonal projection of the pair of first upper differential pads on a geometric plane that the first upper opening is located in is overlapped with the first upper opening, an orthogonal projection of at least a portion of a plurality of pads located between the pair of first upper differential pads and the pair of second upper differential pads of the upper pad lane is not located in the first upper opening, and a portion of at least one ground plane between the pair of first upper differential pads and the pair of first lower differential pads is solid.

16. The plug cable assembly as recited in claim 15, wherein one or more of the ground planes closer to the pair of first lower differential pads each has a first lower opening, an orthogonal projection of the pair of first lower differential pads on a geometric plane that the first lower opening is located in is overlapped with the first lower opening, and an orthogonal projection of at least a portion of a plurality of pads located between the pair of first lower differential pads and the pair of second lower differential pads of the lower pad lane is not located in the first lower opening.

17. The plug cable assembly as recited in claim 16, wherein a number of the ground planes having the first upper opening are greater than a number of the ground planes having the first lower opening.

18. The plug cable assembly as recited in claim 15, wherein one or more of the ground planes closer to the pair of second lower differential pads each has a second lower opening, an orthogonal projection of the pair of second lower differential pads on a geometric plane that the second lower opening is located in is overlapped with the second lower opening, an orthogonal projection of at least a portion of a plurality of pads located between the pair of first lower differential pads and the pair of second lower differential pads of the lower pad lane is not located in the first lower opening and the second opening, and the pair of second upper differential pads and the pair of second lower differential pads have a solid ground plane therebetween.

19. The plug cable assembly as recited in claim 18, wherein one or more of the ground planes closer to the pair of first lower differential pads each has the first lower opening, one or more of the ground planes closer to the pair of second upper differential pads each has a second upper opening, an orthogonal projection of the pair of first lower differential pads on a geometric plane that the first lower opening is located in is overlapped with the first lower opening, an orthogonal projection of at least a portion of a plurality of pads located between the pair of first upper differential pads and the pair of second upper differential pads of the upper pad lane is not located in the first upper opening and the second opening, and an orthogonal projection of the pair of second upper differential pads on a geometric plane that the second upper opening is located in is overlapped with the second upper opening.

20. The plug cable assembly as recited in claim 19, wherein a number of the ground planes having the first upper opening are greater than a number of the ground planes having the first lower opening, and a number of the ground planes having the second lower opening are greater than a number of the ground planes having the second upper opening.

21. The plug cable assembly as recited in claim 15, wherein no trace is disposed between the pair of first upper differential pads and the pair of second upper differential pads on the upper surface.

22. The plug cable assembly as recited in claim 15, wherein no trace is disposed between the pair of first lower differential pads and the pair of second lower differential pads on the lower surface.

23. A plug cable assembly, comprising:
a cable:
a plug: and
a paddle card connecting the cable with the plug, comprising:
  a circuit board having an upper surface and a lower surface opposite to each other;
  a pad group connected to a plurality of terminals of the plug, comprising:
    an upper pad lane disposed on the upper surface and comprising a pair of first upper differential pads and a pair of second upper differential pads on one side of the pair of first upper differential pads; and
    a lower pad lane disposed on the lower surface and comprising a pair of first lower differential pads and a pair of second lower differential pads on one side of the pair of first lower differential pads, wherein the pair of first upper differential pads are corresponding to the pair of first lower differential pads respectively and configured up and down, and the pair of second upper differential pads and the pair of second lower differential pads are corresponding to each other respectively and configured up and down,
    wherein the pair of first upper differential pads is a receiving differential pair, and the pair of first lower differential pads is a transmitting differential pair;
    wherein the pair of first upper differential pads, the pair of first lower differential pads, the pair of second upper differential pads, and the pair of second lower differential pads are electrically disconnected with each other; and
  a plurality of ground planes spaced at intervals between the upper surface and lower surface, wherein one or more of the ground planes closer to the pair of first upper differential pads each has a first upper opening, an orthogonal projection of the pair of first upper differential pads on a geometric plane that the first upper opening is located in is overlapped with the first upper opening, an orthogonal projection of at least a portion of a plurality of pads located between the pair of first upper differential pads and the pair of second upper differential pads of the upper pad lane is not located in the first upper opening, and a portion of at least one ground plane between the pair of first upper differential pads and the pair of first lower differential pads is solid.

24. The plug cable assembly as recited in claim 23, wherein one or more of the ground planes closer to the pair of first lower differential pads each has a first lower opening, an orthogonal projection of the pair of first lower differential pads on a geometric plane that the first lower opening is located in is overlapped with the first lower opening, and an orthogonal projection of at least a portion of a plurality of pads located between the pair of first lower differential pads and the pair of second lower differential pads of the lower pad lane is not located in the first lower opening.

25. The plug cable assembly as recited in claim 24, wherein a number of the ground planes having the first upper opening are greater than a number of the ground planes having the first lower opening.

26. The plug cable assembly as recited in claim 23, wherein one or more of the ground planes closer to the pair of second lower differential pads each has a second lower opening, an orthogonal projection of the pair of second lower differential pads on a geometric plane that the second lower opening is located in is overlapped with the second lower opening, an orthogonal projection of at least a portion of a plurality of pads located between the pair of first lower differential pads and the pair of second lower differential pads of the lower pad lane is not located in the first lower opening and the second opening, and the pair of second upper differential pads and the pair of second lower differential pads have a solid ground plane therebetween.

27. The plug cable assembly as recited in claim 26, wherein one or more of the ground planes closer to the pair of first lower differential pads each has the first lower opening, one or more of the ground planes closer to the pair of second upper differential pads each has a second upper opening, an orthogonal projection of the pair of first lower differential pads on a geometric plane that the first lower opening is located in is overlapped with the first lower opening, an orthogonal projection of at least a portion of a plurality of pads located between the pair of first upper differential pads and the pair of second upper differential pads of the upper pad lane is not located in the first upper opening and the second opening, and an orthogonal projection of the pair of second upper differential pads on a geometric plane that the second upper opening is located in is overlapped with the second upper opening.

28. The plug cable assembly as recited in claim 27, wherein a number of the ground planes having the first upper opening are greater than a number of the ground planes having the first lower opening, and a number of the ground planes having the second lower opening are greater than a number of the ground planes having the second upper opening.

29. The plug cable assembly as recited in claim 23, wherein no trace is disposed between the pair of first upper differential pads and the pair of second upper differential pads on the upper surface.

30. The plug cable assembly as recited in claim 23, wherein no trace is disposed between the pair of first lower differential pads and the pair of second lower differential pads on the lower surface.

* * * * *